United States Patent [19]

Mikami et al.

[11] Patent Number: 4,670,968
[45] Date of Patent: Jun. 9, 1987

[54] METHOD OF IMPLANTING UNIFORM CONCENTRATIONS IN SOLIDS HAVING PREDETERMINED ANGULAR RELATIONSHIP WITH THE ION-BEAM

[75] Inventors: Hitoshi Mikami, Kawasaki; Katsuyoshi Fukuda, Yokosuka; Shigeru Yasuami, Kawasaki, all of Japan

[73] Assignee: Kabushiki Kaisha Toshiba, Kawasaki, Japan

[21] Appl. No.: 799,109

[22] Filed: Nov. 18, 1985

[30] Foreign Application Priority Data

Mar. 27, 1985 [JP] Japan ................................ 60-62306

[51] Int. Cl.$^4$ .......................................... H01L 21/263
[52] U.S. Cl. .................................... 29/576 B; 29/571; 148/1.5; 148/187; 148/DIG. 83; 357/91; 427/35
[58] Field of Search ............... 29/576 B, 571; 148/1.5, 148/187; 357/91; 427/35

[56] References Cited

U.S. PATENT DOCUMENTS 4,404,233  9/1983  Ikeda et al. ........................... 427/35
4,461,072  7/1984  Wada et al. ........................... 29/571
4,481,042  11/1984 Takigawa et al. .................... 148/1.5
4,558,509  12/1985 Tiwari ................................ 29/576 B
4,575,922  3/1986  Nemiroff ............................. 29/574

FOREIGN PATENT DOCUMENTS 60-733  1/1985  Japan .

OTHER PUBLICATIONS

Matzke, Phys. Stat. Soc. 89 (1971) 99.
Lee et al, Appl. Phys. Letts. 37 (1980) 311.
McLaughlin et al, Appl. Phys. Letts. 44 (1984) 252.
Blunt et al. in Ion-Implantation . . . Techniques ed, Ryssel et al, Springer-Verlag, Berlin, 1983, p. 443.
"Face Uniformity and Face Channeling in the Si Injection into GaAs", 13a-J-7 Preprint of Lectures in 1984 Autumn Applied-Physics Society, Yasuhiro Kawasaki et al, (Atsugi-Tsu-Ken).

*Primary Examiner*—Upendra Roy
*Attorney, Agent, or Firm*—Oblon, Fisher, Spivak, McClelland & Maier

[57] ABSTRACT

A method of manufacturing a semiconductor device involves the step of carrying out the implantation of an impurity in the main plane of a GaAs substrate for the simultaneous formation of a plurality of regions. When the angles formed with the perpendicular implantation of silicon ions in the GaAs main plane and the main orientations of GaAs substrate are expressed by the Euler angles $(\lambda, \mu, \theta)$, then the crystal orientation is so prescribed as to satisfy the following conditions:

$11° < \lambda < 33°$
$7° < \mu < 24°$
$\theta \approx 0°$, thereby suppressing the occurrence of channeling in the implantation of ions in the substrate main plane and consequently ensuring substantially uniform impurity concentration in the plural regions.

5 Claims, 10 Drawing Figures

F I G. 2
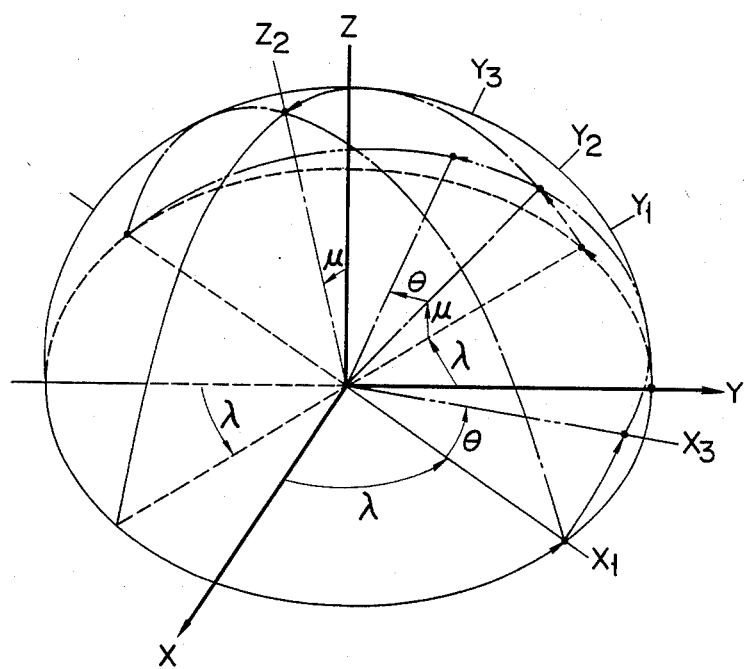

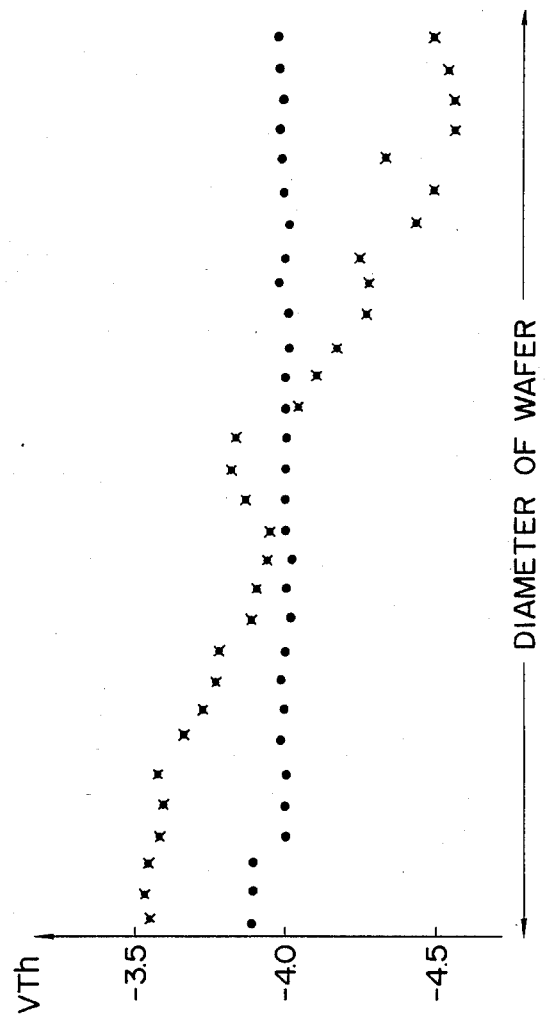
F I G. 4

METHOD OF IMPLANTING UNIFORM CONCENTRATIONS IN SOLIDS HAVING PREDETERMINED ANGULAR RELATIONSHIP WITH THE ION-BEAM

BACKGROUND OF THE INVENTION

This invention relates to a method of manufacturing a semiconductor device involving the step of impurity ion implantation. When a semiconductor device is manufactured, the well-known process is one which involves the step of implanting impurity ions in a substrate to fabricate a layer of a prescribed conductivity type. In the case of, for example, a GaAs integrated circuit, an active layer is produced in a semiconductor substrate by ion implantation to provide source and drain regions of high impurity concentration. Due to the high integration and increased speed of operation of semiconductor devices, greater demand is made for the precise control of ion implantation.

When a layer of a prescribed conductivity type is formed by ion implantation, it sometimes happens that a channeling phenomenon appears, in which an impurity ion is implanted to a greater depth in a particular direction of implantation depending on the structure of a single crystal substrate. With a semiconductor single crystal substrate whose surface parallel to the (100) plane, it is known that when the implantation of an impurity is carried out perpendicularly to the substrate, an axial channeling takes place because crystal lattices are widely separated from each other. The phenomenon of channeling becomes more noticeable as the constituent atoms of the substrate, and ions to be implanted have a larger atomic number, and the acceleration voltage for ion implantation decreases. When, therefore, an activated layer is made thinner for higher integration, the channeling more readily takes place. The conventional practice to avoid such a drawback is to incline the main substrate plane by some degrees to the ion implantation direction in order to avoid axial channeling, and further, to rotate the substrate about the surface normal axis several or scores of degrees, thereby avoiding plane channeling.

The conventional method of manufacturing semiconductor devices mentioned before is also accompanied with the following drawbacks. Since ion beams enter obliquely into the substrate surface, the mask material gives rise to shades, causing the patterns to be asymmetric and resulting in variation in the properties of the element devices thus produced. Moreover, difficulties arise in estimating the area ion implantated from the mask size. The smaller the pattern becomes for high integration, the more the drawbacks increase. Since the respective positions on the substrate have different separations from the ion source, said positions are electrically charged to different degrees by an ion beam-accelerating electric field, thus causing ions to be implanted with different densities. Consequently variations appear in the properties of the element devices formed on the substrate. Moreover, some ion-implanting devices do not allow the substrate rotation angle to be freely defined. When, therefore, such an ion-implanting device is used, it is impossible to produce highly reliable semiconductor devices. Therefore, the rotation angle of the substrate plane has to be determined for each substrate, requiring a great deal of work.

The above-mentioned difficulties particularly arise in a semiconductor device having an extremely fine circuit arrangement, for example, a high speed digital IC or a high frequency analog IC fabricated by forming an MESFET on a GaAs single crystal substrate.

SUMMARY OF THE INVENTION

It is accordingly the object of this invention to provide a method of manufacturing a semiconductor device which suppresses the occurrence of channeling when a plurality of regions are simultaneously formed in a monocrystalline, semiconductor substrate; by implantation of an impurity; and which substantially equalizes the impurity concentrations of the respective regions, thus significantly facilitating the mask of ion implantation.

The semiconductor device-manufacturing method embodying this invention is characterized in that when an impurity is implanted in the main phase of the monocrystalline semiconductor substrate, and when the angle of ion implantation direction with respect to the main crystal orientation of said crystal is assumed to be expressed by Euler angles $\lambda$, $\mu$, $\theta$), then the main crystal orientation is so determined as to satisfy the following conditions:

$11° < \lambda < 33°$
$7° < \mu < 24°$
$\theta \approx 0°$

If $\lambda$ falls outside of the above-mentioned range, plane channeling appears, and if $\lambda$ exceeds 33°, the subject semiconductor monocrystalline substrate will be undesirably reduced in machinability. If $\mu$ is displaced from the above-mentioned range, then axial channelling will appear. Also if $\mu$ rises above 24°, the monocrystalline semiconductor substrate will undesirably decrease in machinability.

The present invention offers the advantages that even when an impurity is perpendicularly implanted in a monocrystalline semiconductor substrate, no channeling occurs, dispensing with the troublesome task of defining the rotation angle of the substrate; when an ion implanter lacking a rotation angle-defining mechanism is applied, it is nonetheless possible to carry out ion implantation under a well-controlled condition; when an impurity is implanted perpendicularly to the main substrate plane, the implanted impurity does not present asymmetry and variations in the distribution within said substrate plane; an equal potential is preserved throughout the substrate plane; an impurity can be implanted under a well controlled condition; it is possible to provide a semiconductor device whose excellent elements indicate no variations in the properties on the substrate plane; and consequently a highly integrated semiconductor device can be provided.

BRIEF DESCRIPTION OF THE DRAWINGS

FIG. 2 is a chart setting forth the Euler angles;

FIG. 4 indicates a comparison between the threshold voltage variations observed in a semiconductor device manufactured by the method utilized in this invention and those appearing in a semiconductor device obtained by the conventional manufacturing method.

DETAILED DESCRIPTION OF THE PREFERRED EMBODIMENT

Description may now be made with reference to the accompanying drawings of the method of manufacturing a semiconductor device GaAs MESFET utilized in this invention.

Figure 1:
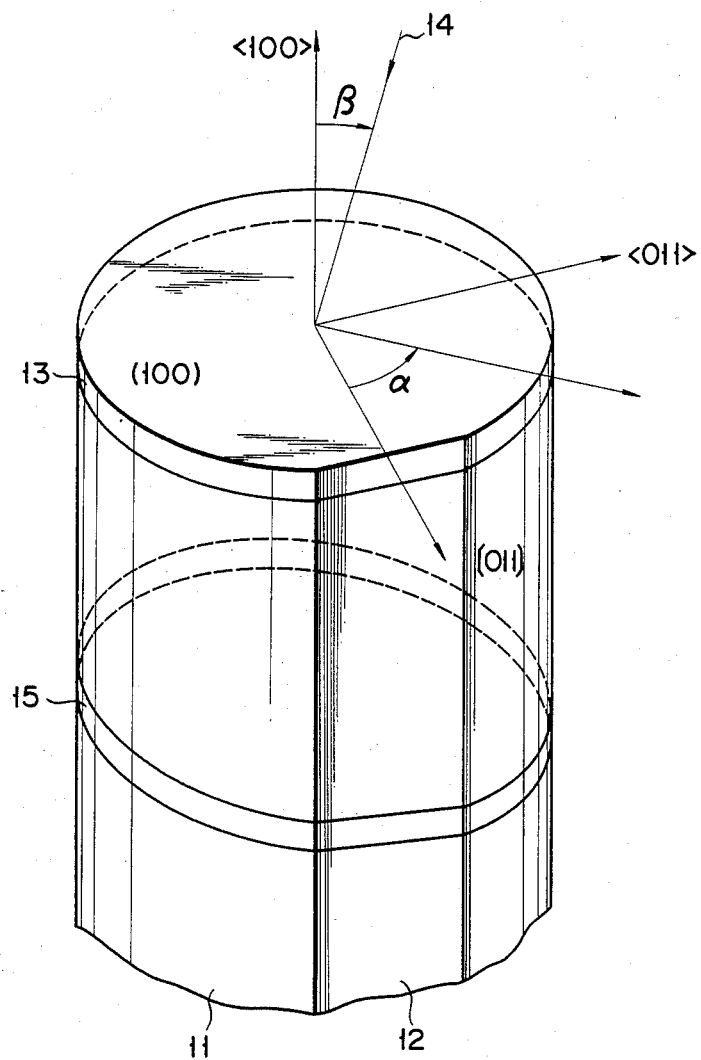
FIG. 1 illustrates an ignot by way of indicating the relationship between the crystal orientation in which the substrate used in the embodiment of this invention is cut out and the direction in which an impurity is implanted in the substrate.

FIG. 1 sets forth the relationship between the crystal orientation in which a gallium arsenide (GaAs) substrate is cut out in accordance with the method of this invention and the direction in which an impurity is implanted. Referring to FIG. 1, reference numeral 11 shows a GaAs ingot, and reference numeral 12 indicates an orientation flat formed on a (011) face. When an impurity is implanted in a GaAs substrate 13 cut out of said ingot 11 by the conventional method, as previously mentioned, ion implantation direction 14 is inclined to a (100) face at prescribed angle $\beta$ ($\approx 7°$) in order to suppress the occurrence of axial channeling, and further the plane of said GaAs substrate 13 is rotated at angle $\alpha$ ($\approx 20°$) in order to avoid plane channeling.

Unlike the above-mentioned conventional method, the embodiment of this invention applies the method of cutting out semiconductor monocrystalline substrate 15 from GaAs ingot 11 in such a manner that the substrate's main plane is inclined to the indicated (100) face at a prescribed angle as later described. Namely, the main plane of said GaAs substrate is so defined as to suppress the occurrence of axial and plane channelings in ion implantation direction 14.

Concrete description may now be made by the Euler angles of the range within which angle inclination to the (100) face of the GaAs substrate is defined by the embodiment of this invention. The Euler angles ($\lambda$, $\mu$, $\theta$) are generally indicated as shown in FIG. 2. Namely, angles (0°,0°,0°) represented by the equation $\lambda = \mu = \theta = 0°$ are plotted on axes X, Y, Z. It was assumed that under the above-mentioned conditions, the ion implantation direction was represented by axis Z, and the angles defined by the ion implantation direction with the main crystal axis were denoted by $\lambda$, $\mu$, $\theta$. Further, it was assumed that the size of an atom at a crystal lattice point was represented by 1/10 of the lattice spacing. First, the plane involving said $\lambda$, $\mu$ and $\theta$ is rotated counterclockwise about the Z axis by an angle of $\lambda$. At this time, line X is shifted to $X_1$, and line Y is moved to $Y_1$. Thereafter, said plane is rotated counterclockwise about line $X_1$ by an angle of $\mu$. As a result, line $Y_1$ is shifted to $Y_2$, and line Z is moved to $Z_2$. Further, said plane is rotated counterclockwise about line $Z_2$ by an angle of $\theta$. At this time, line $X_1$ is shifted to $X_3$, and line $Y_2$ is moved to $Y_3$. Computation was made as to the pattern which would be presented by a crystal lattice. Measurement was made of the angles which would not cause the lattice points to overlap each other three-dimentionally. As a result, the following conditions were ascertained.

$11° < \lambda < 33°$
$7° < \mu < 24°$
$\theta \approx 0°$.

In actuality, a GaAs substrate was prepared whose main plane represented the aforesaid crystal orientation. A silicon (Si+) impurity ion was implanted under the conditions:
Acceleration voltage: 150 keV.
Impurity doping concentration: $3 \times 10^{12}/cm^2$.

Thus, numerous diode alleys were formed and determination was made of the manner in which the peak carrier concentration was distributed. As a result, it was found that said concentration fell within the range of 3%. When Euler angle $\lambda$ ranged between 21° and 26°, and Euler angle $\mu$ ranged from 10° to 11°, said peak carrier concentration was less than 1%. Electronic line analysis clarified that the above-mentioned ranges represented the ion implantation direction in which the occurrence of defect of ion implantation was minimized.

When a GaAs substrate whose Euler angles were defined to fall within the aforementioned range was cut out of an ingot, it was found that axial and plane channeling were effectively prevented when an impurity was implanted perpendicularly to the main plane of said GaAs substrate. The present invention offers further advantages that since an impurity can be implanted perpendicularly to the main substrate plane, the impurity implanting process is simplified and can be carried out under tightly controlled conditions; though the cleavage plane constituted by (110) face of the GaAs monocrystalline is susceptible to impacts and fractures readily, yet the main plane of said GaAs crystal is shifted from said (100) face at a prescribed angle in order to suppress the occurrence of channeling, said cleavage plane is not rendered perpendicular to the substrate main plane, thereby improving the impact strength of the subject GaAs-MESFET.

Description may now be made with reference to FIGS. 3A to 3G of the method of manufacturing the GaAs-MESFET utilized in this invention. Throughout the figures, reference numeral 31 represents a monocrystalline semiconductor substrate prepared from gallium arsenide (GaAs). The substrate is cut out of an ingot in such a manner that the main plane of said substrate represents a crystal orientation in which Euler angles $\lambda$, $\mu$ and $\theta$ respectively denote 21°, 11° and 0°, and thereafter said main plane is polished. An ion implantation mask is provided on said main plane of GaAs substrate 31 by means of a first photoresist layer 32a. Next, a silicon (Si+) impurity is implanted perpendicularly into the main plane of the substrate under the conditions:
Acceleration Voltage: 150 keV.
Doping concentration: $3 \times 10^{12}/cm^2$.

Figure 3A:
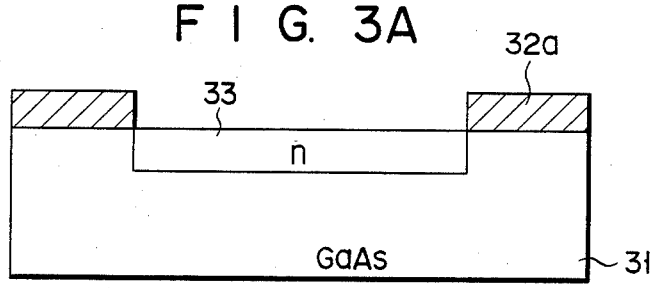
FIGS. 3A to 3G show the sequential steps of manufacturing GaAs-MESFET embodying this invention.
Figure 3B:
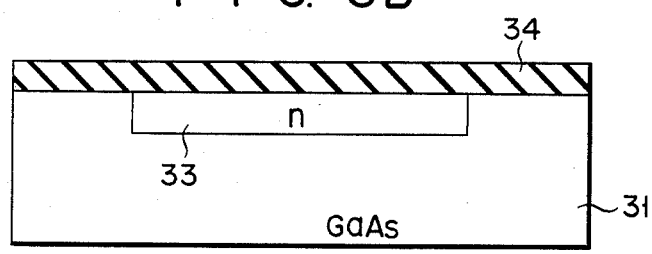
Figure 3C:
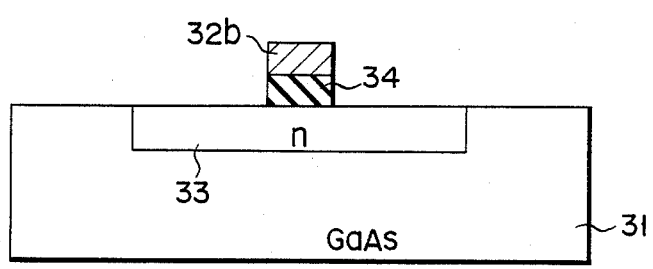
Figure 3D:
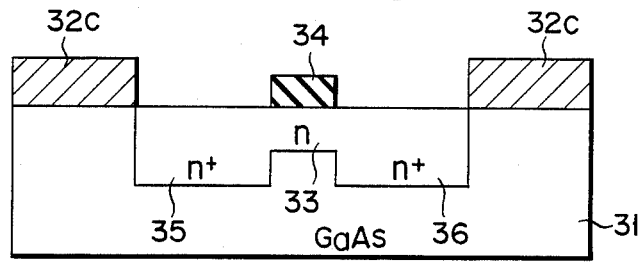

As a result, an n type conductivity layer 33 is deposited on the main plane of the substrate. Thereafter, the first resist layer 32a is removed from the main plane of the substrate. Heat treatment is continued at 850° C. for 15 minutes to activate said n-type conductivity layer 33. Thereafter tungsten nitride layer 34 is deposited with a thickness of 1000 Å over the phase surface of substrate 31 as indicated in FIG. 3B. A second photoresist layer 32b is formed on said tungsten nitride layer 34. A gate electrode-forming mask is provided by etching said second photoresist layer 32b except for that portion thereof which lies on the central portion of said n-type layer 33. Later as shown in FIG. 3C, gate electrode 34 is mounted on the n-type conductivity layer by reactive ion etching (RIE) by means of the aforementioned mask. Then said second photoresist layer 32b is removed from gate electrode 34. Then third photoresist layer 32c is formed all over the fabricated mass. That portion of said photoresist layer 32c which is mounted on said n-type layer is eliminated to provide a mask open to the MESFET forming region. Thereafter as shown in FIG. 3D, silicon is ion implanted by means of said mask perpendicularly to the main plane of the substrate under the conditions:

Acceleration voltage: 180 keV.

Figure 3E:
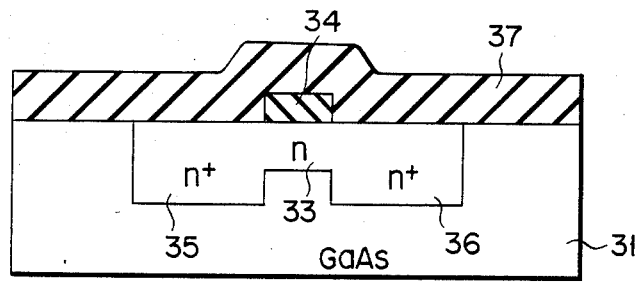
Figure 3F:
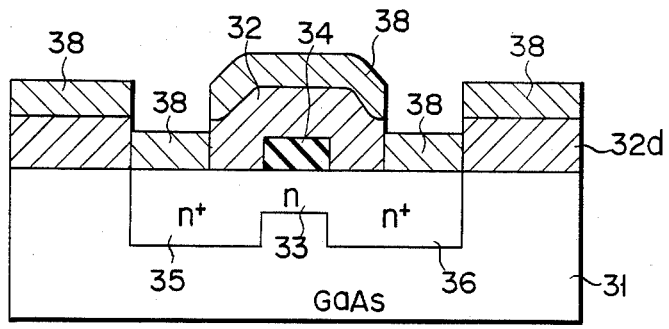
Figure 3G:
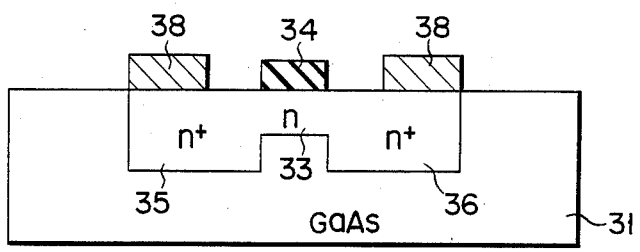

Doping concentration: $2 \times 10^{13}/cm^2$.

to provide source and drain regions 35, 36 both of n+- type. Later said third photoresist layer 32c is eliminated, and silicon oxide (SiO$_2$) layer 37 is deposited with a thickness of about 5000 Å by chemical vapor deposition (CVD) all over the fabricated mass (FIG. 3E). The whole mass is heat treated at 800° C. for 15 minutes to activate the silicon constituting the source and drain regions. Later SiO$_2$ layer 37 is removed from the substrate. A fourth resist layer 32d is formed on that part of the substrate which is now rendered vacant by the removed of said SiO$_2$ layer 37. Those portions of said fourth resist layer 32d which were deposited on said source and drain regions are eliminated to form a mask open to the region for drawing out the source and drain electrodes. Later, as shown in FIG. 3F, a gold germanium alloy (AuGe) layer of 1500 Å thick is formed, and then gold (Au) is thermally deposited on said AuGe layer. Thus an AuGe/Au layer is formed all over the fabricated layer. Later, fourth photoresist layer 32d, together with that portion of said AuGe/Au layer which is deposited thereon, is removed (lift off step). Last, heat treatment is applied at 400° C. for 2 minutes to provide source and drain ohmic electrodes, thereby finishing the GaAs-MESFET method used in this invention.

The foregoing description was made of the process seemingly for manufacturing a single FET unit. In fact, however, a large number of FETs are formed on the substrate at the same time, as can be easily inferred.

Measurement was made of threshold voltages Vth of the numerous GaAs-MESFETs of this invention simultaneously fabricated on the same substrate, the results being set forth in the coordinate system of FIG. 4. The ordinate represents the threshold voltages Vth and the abscissa denotes the diameter of the wafer. The circular plotted points ( • ) show the measured threshold voltages of the MESFET representing the invention, and the cross-shaped plotted points (×) represent the threshould voltages of an FET unit fabricated by including the wafer by 7 degrees in the ion implantation direction and further rotating the wafer lane by 210 degrees (corresponding to the conventional process). The pattern of the coordinate system of FIG. 4 clearly indicates that the threshould voltage of all the MESFETs manufactured by the method of this invention substantially stands at −4.0 volts, whereas noticeable variations appear in the threshold voltage of the MESFETs provided by the conventional process. The above-mentioned noticeable merit of the present invention arises from the fact that the source and drain regions of the elements fabricated by the method of this invention have a substantially uniform impurity concentration, no matter where said regions are formed in the substrate wafer.

In the foregoing embodiment, the MESFET was prepared from a monocrystalline GaAs substrate having the structure of sphalerite. However, the present invention is not limited to this instance. Namely, the same effect can be ensured by fabricating any monocrystalline substrate having a diamond structure such as that prepared from Si, Ge or InP. Further, not only silicon, but also any other impurities known to this particular field, for example, S, Se, Mg, are adapted for ion implantation.

What is claimed is:

1. A method of manufacturing a semiconductor device, comprising:

preparing a monocrystalline semiconductor substrate having a main plane and a crystal orientation with respect to said main plane, and which said crystal orientation is expressed by Euler angles ($\lambda$, $\mu$, $\theta$), wherein $11° < \lambda < 30°$, $7° < \mu < 24°$, and $\theta \approx 0°$; and implanting an impurity in the main plane of said monocrystalline semiconductor substrate for the simultaneous formation of a plurality of impurity regions at an angle perpendicular to the main plane of said semiconductor substrate, thereby suppressing the occurrence of channeling in the implantation of an impurity in said substrate main plane and consequently ensuring substantially uniform impurity concentration in said plurality of regions.

2. The manufacturing method according to claim 1 wherein the angles which the direction of said ion implantation defines with the main orientation of the single crystal substrate are defined as follows:

$21° < \lambda < 26°$ $10° < \mu < 11°$ $\theta \approx 0°$.

3. The manufacturing method according to claim 1, wherein said substrate is prepared from a single crystal having the structure of sphalerite or diamond structure.

4. The manufacturing method according to claim 3, wherein said single crystal substrate is prepared from semiconductor gallium arsenide.

5. The manufacturing method according to claim 4, wherein said impurity is silicon.

* * * * *